US011420282B2

(12) United States Patent
Hiraoka et al.

(10) Patent No.: US 11,420,282 B2
(45) Date of Patent: Aug. 23, 2022

(54) SOLDERING DEVICE (71) Applicant: Hitachi, Ltd., Tokyo (JP)

(72) Inventors: Miki Hiraoka, Tokyo (JP); Shinya Kawakita, Tokyo (JP); Masayuki Kyoi, Tokyo (JP); Osamu Ikeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 938 days.

(21) Appl. No.: 16/305,705

(22) PCT Filed: Nov. 27, 2017

(86) PCT No.: PCT/JP2017/042460
§ 371 (c)(1),
(2) Date: Nov. 29, 2018

(87) PCT Pub. No.: WO2018/142733
PCT Pub. Date: Aug. 9, 2018

(65) Prior Publication Data
US 2020/0376580 A1    Dec. 3, 2020

(30) Foreign Application Priority Data
Feb. 1, 2017    (JP) .............................. JP2017-016631

(51) Int. Cl.
*B23K 3/00*    (2006.01)
*B23K 3/06*    (2006.01)
(Continued)

(52) U.S. Cl.
CPC ............ *B23K 3/0615* (2013.01); *B23K 3/025* (2013.01); *B23K 3/04* (2013.01)

(58) Field of Classification Search
CPC ........ B23K 3/0615; B23K 3/025; B23K 3/04; B23K 3/047; B23K 2101/38; B23K 3/0623–0638; H05K 3/34
(Continued)

(56) References Cited

U.S. PATENT DOCUMENTS 5,364,011 A * 11/1994 Baker .................... B23K 1/012
228/33
5,626,277 A * 5/1997 Kawada ............... B23K 3/0623
228/41
(Continued)

FOREIGN PATENT DOCUMENTS

JP    4-28477 A    1/1992
JP    2013-77840 A    4/2013
(Continued)

OTHER PUBLICATIONS

Machine translation of JP2013077840A (no date available).*
(Continued)

*Primary Examiner* — Kiley S Stoner
(74) *Attorney, Agent, or Firm* — Crowell & Moring LLP (57) ABSTRACT A soldering device capable of shortening operation time of soldering and suppressing solder non-wetting is provided. A soldering device includes: a plurality of tubular solder piece guide tubes which have space therein for a solder piece supplied from a supply port to pass through; a first holding unit which holds the solder piece guide tubes; and a heating unit which heats the first holding unit. Tip end portions of the solder piece guide tubes on a soldering side are arranged on an inner side of the first holding unit.

7 Claims, 5 Drawing Sheets

(51) Int. Cl.
 *B23K 3/02* (2006.01)
 *B23K 3/04* (2006.01)
(58) Field of Classification Search
 USPC .................................. 228/33, 41, 245–262
 See application file for complete search history.

(56) References Cited

U.S. PATENT DOCUMENTS

| | | | | |
|---|---|---|---|---|
| 6,123,248 | A * | 9/2000 | Tadauchi | B23K 1/06 |
| | | | | 228/111.5 |
| 6,708,873 | B2 * | 3/2004 | Gruber | H01L 21/486 |
| | | | | 118/50 |
| 11,247,285 | B1 * | 2/2022 | Collins | B65G 47/20 |
| 2003/0168498 | A1 * | 9/2003 | Suter | B23K 1/012 |
| | | | | 228/256 |
| 2004/0011852 | A1 * | 1/2004 | Uebel | B23K 3/0607 |
| | | | | 228/43 |
| 2008/0179035 | A1 * | 7/2008 | Gruber | B22D 17/2023 |
| | | | | 164/113 |
| 2011/0272452 | A1 * | 11/2011 | Lam | B23K 1/20 |
| | | | | 228/180.21 |
| 2016/0016247 | A1 * | 1/2016 | An | B23K 3/0623 |
| | | | | 228/41 |
| 2017/0203379 | A1 * | 7/2017 | Matsumoto | B23K 1/0056 |
| 2018/0056423 | A1 * | 3/2018 | Ebisawa | H05K 3/34 |
| 2019/0262925 | A1 * | 8/2019 | Ebisawa | B23K 3/025 |

FOREIGN PATENT DOCUMENTS

| | | | | |
|---|---|---|---|---|
| JP | | 6004029 B1 * | 10/2016 | ............. B23K 1/002 |
| JP | | 6010837 B2 * | 10/2016 | ........... B23K 1/0016 |
| JP | 2017-112243 A | | 6/2017 | |

OTHER PUBLICATIONS

International Search Report (PCT/ISA/210) issued in PCT Application No. PCT/JP2017/042460 dated Dec. 19, 2017 with English translation (three (3) pages).
Japanese-language Written Opinion (PCT/ISA/237) issued in PCT Application No. PCT/JP2017/042460 dated Dec. 19, 2017 (five (5) pages).

* cited by examiner

|  | HEATER TEMPERATURE | HEATING TIME | SUBSTRATE OFFSET AMOUNT |
|---|---|---|---|
| CONVENTIONAL EXAMPLE | 550°C | 9s (PREHEATING: 4s, SOLDERING TIME: 5s) | 0mm |
| EXAMPLE | 400°C | 10s (PREHEATING: 3s, SOLDERING TIME: 7s) | 0mm |

[Fig. 6]

|  |  | CONVENTIONAL DEVICE | PRESENT INVENTION |
|---|---|---|---|
| PRESENCE OF SOLDER NON-WETTING ON SUBSTRATE REAR SURFACE SIDE | ASSIST HEATING PERFORMED | O<br>NO | O<br>NO |
|  | NO ASSIST HEATING | ✕<br>YES | O<br>NO |

SOLDERING DEVICE

TECHNICAL FIELD

The present invention relates to a soldering device.

BACKGROUND ART

There is known a method of using a tubular soldering iron to solder a land of a wiring substrate and a terminal of an insertion mounting component. For example, PTL 1 discloses an electronic equipment manufacturing device wherein a tube, which a soldering iron having both ends opened, is heated by a heating unit, and thread solder, which drops inside the tube and reaches a land, is heated and melted at a tip end portion of the tube.

According to the method described in PTL 1, inside the tube which is a closed space, the thread solder is melted and the land and a pin can be bonded to each other with a certain amount of solder material. Therefore, it is possible to suppress scattering of solder balls and flux residues onto a wiring substrate, and to prevent electrical short-circuit failures between terminals.

CITATION LIST

Patent Literature

PTL 1: JP-A-2013-77840

SUMMARY OF INVENTION

Technical Problem

However, in the technique described in PTL 1, when a large number of terminals are to be soldered to the wiring substrate, it is necessary to perform soldering for each of the terminals, so that it takes a long time for the soldering operation, and the productivity is low. In addition, on the wiring substrate, when the heat capacity of an inner layer or a lead wire connected to the land is large, a temperature of the iron tip is lowered, so that sufficient quantity of heat cannot be ensured to the rear surface side of the wiring substrate, and thus solder non-wetting may occur.

Therefore, an object of the invention is to provide a soldering device capable of shortening the operation time of soldering and suppressing solder non-wetting.

Solution to Problem

A preferred embodiment of the soldering device according to the invention includes: a plurality of tubular solder piece guide tubes which have space therein for a solder piece supplied from a supply port to pass through; a first holding unit which holds the plurality of solder piece guide tubes; and a heating unit which heats the first holding unit. Tip end portions of the solder piece guide tubes on a soldering side are arranged on an inner side of the first holding unit.

Advantageous Effect

According to the invention, a soldering device capable of shortening the operation time of soldering and suppressing the solder non-wetting can be achieved.

DESCRIPTION OF EMBODIMENTS

Examples

Figure 1:
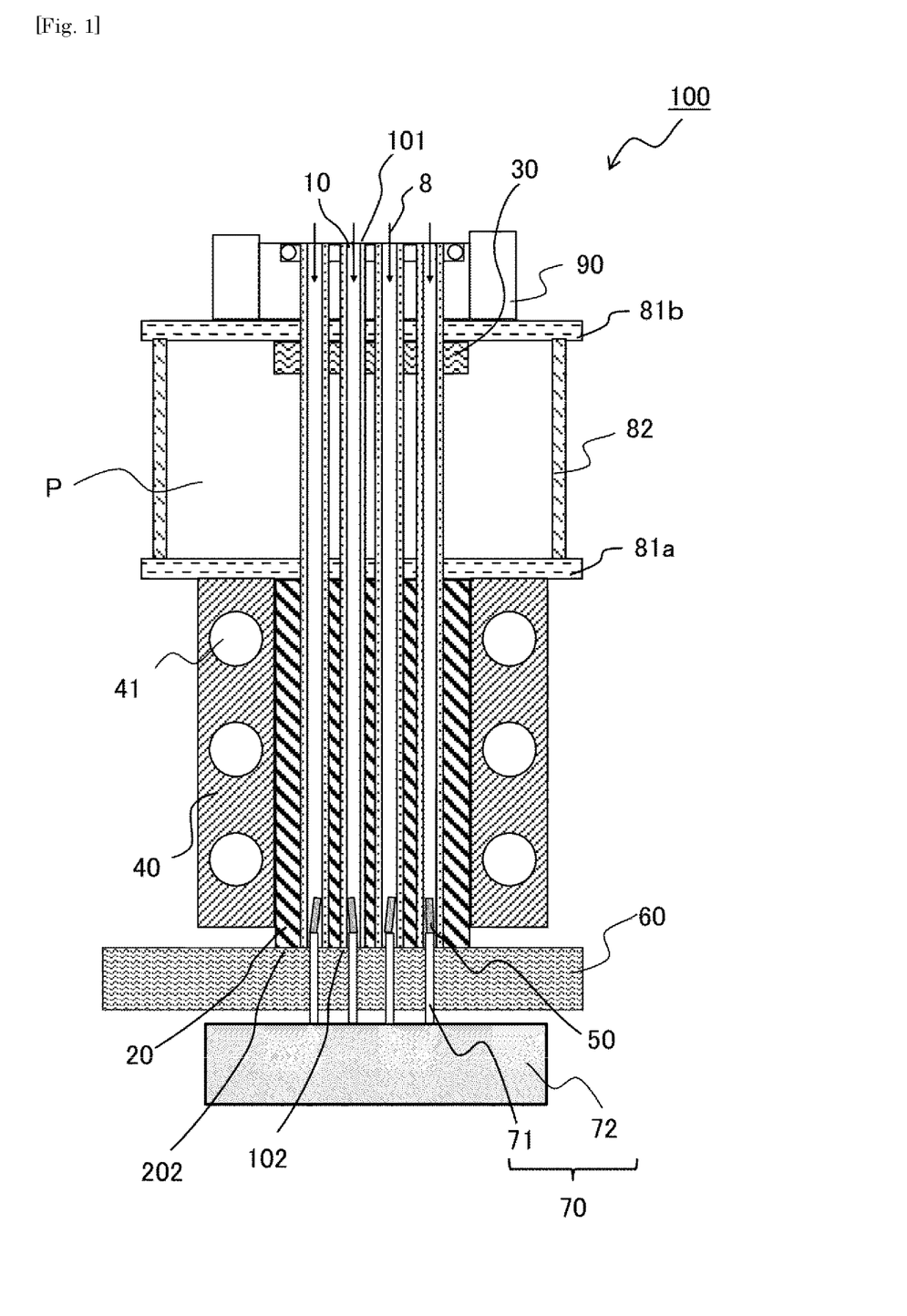
FIG. 1 is a sectional view of a soldering device according to an example.

FIG. 1 is a sectional view of a soldering device according to an example. As shown in FIG. 1, a soldering device 100 according to the example includes a plurality of solder piece guide tubes 10 and a first holding unit 20 which holds the solder piece guide tubes 10.

Figure 2A:
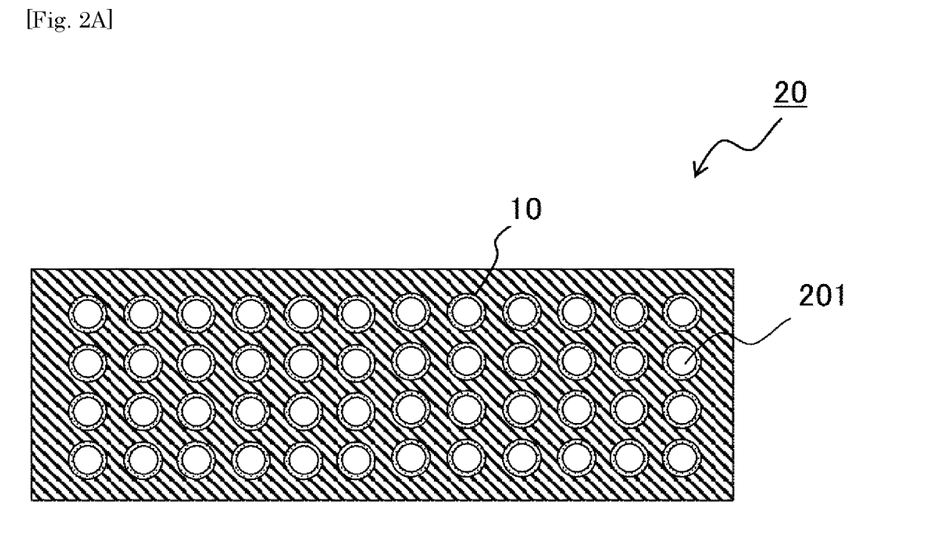
FIG. 2A is a bottom view of a first holding unit 20 in which solder piece guide tubes 10 are inserted, as seen from a lower end surface side of the solder piece guide tubes 10.

The solder piece guide tubes 10 are tubular bodies having both ends opened and have space therein for thread solder pieces 50 supplied from solder piece supply ports 101 to pass through. The first holding unit 20 is a plate-shaped body made of metal, and includes a plurality of hole portions 201 as shown in FIG. 2A. A portion of each of the solder piece guide tubes 10 on a side of tip end portions 102 on a soldering side (hereinafter, simply referred to as the tip end portion 102 of the solder piece guide tube 10) is inserted in the hole portion 201 of the first holding unit 20 so as to be held. Outer peripheral surfaces of the solder piece guide tubes 10 are in contact with inner peripheral surfaces of the hole portions 201 of the first holding unit 20. The tip end portions 102 of the solder piece guide tubes 10 are arranged on an inner side of the first holding unit 20. In the example shown in FIG. 1, the tip end portions 102 of the solder piece guide tubes 10 are arranged on the same plane as a lower end surface 202 of the first holding unit 20.

A heating unit 40 which heats the first holding unit 20 is provided on both side surfaces of the first holding unit 20. The heating unit 40 includes a heater 41 which generate heat by energization.

The portions of the solder piece guide tubes 10 on a side of the solder piece supply ports 101 are held by a second holding unit 30. The second holding unit 30 is a plate-shaped body made of resin and includes a plurality of hole portions. The solder piece guide tubes 10 are inserted in the hole portions.

A support plate 81a is provided on upper surfaces of the first holding unit 20 and the heating unit 40 and has an area which covers the upper surfaces. A support plate 81b having substantially the same area as the support plate 81a is provided on an upper surface of the second holding unit 30. Support pillars 82 are provided at four corners between the support plates 81a and 81b. A fixing unit 90 for fixing the solder piece supply ports 101 of the solder piece guide tubes 10 is provided on the second holding unit 30 via the support plate 81b. Hole portions are formed respectively in the support plates 81a, 81b and the fixing unit 90 in the similar arrangement as in the first holding unit 20 and the second holding unit 30. The solder piece guide tubes 10 are inserted in each of the hole portions.

A region P of the solder piece guide tube 10 between a portion thereof held by the first holding unit 20 and a portion thereof held by the second holding unit 30 is exposed to external space between the support plates 81a and 81b.

A wiring substrate 60 is arranged below the soldering device 100. Terminals 71 fixed to a housing 72 of an insertion mounting component 70 are inserted in each through hole of the wiring substrate 60. In each through hole, a through-hole land (not shown) is formed from the inner wall to the substrate surface. The wiring substrate 60 is arranged such that protruding portions of the terminals 71 inserted in each through hole on the upper side in FIG. 1 are inserted into each solder piece guide tube 10 of the soldering device 100. The lower end surface 202 of the first holding unit 20 abuts on a surface of the wiring substrate 60 arranged as described above.

The solder piece guide tube 10 may be formed of any material having heat resistance to withstand a temperature of about 600° C., and at least the inner peripheral surface of the solder piece guide tube 10 is formed of a material which is difficult to be wetted by solder materials. The solder piece guide tube 10 may be formed of a single material or may be formed by a combination of a plurality of materials.

From the viewpoint of obtaining properties including above-described heat resistance and being difficult to be wetted by the solder materials, the solder piece guide tube 10 is desirably formed of inorganic materials such as glass and ceramic, or non-wettable metals such as aluminum, stainless steel, and titanium. The solder piece guide tube 10 may be formed by a combination of such materials. For example, glass can be suitably used since glass has heat resistance, is difficult to be wetted by a solder material, and is low in cost.

The first holding unit 20 may be formed of any material having heat resistance to withstand a temperature of about 600° C., and at least the lower end surface of the first holding unit 20 is formed of a metal material which is difficult to be wetted by solder materials. The first holding unit 20 is desirably formed of a material having the above-described heat resistance and excellent thermal conductivity. Specifically, the first holding unit 20 is desirably formed of aluminum or stainless steel.

A resin material having heat resistance to withstand a temperature of about 100° C. can be used in the second holding unit 30. Polyacetal resin, polycarbonate resin, epoxy resin, phenol resin, or the like are desirably used in the second holding unit 30.

Next, a soldering operation using the soldering device 100 shown in FIG. 1 will be described. First, when the heater 41 of the heating unit 40 is energized, heat of the heater 41 is transmitted to the first holding unit 20, and the first holding unit 20 is thus heated.

As described above, in the soldering device 100 according to the example, since the tip end portion 102 of the solder piece guide tube 10 is arranged in the first holding unit 20 without protruding from the first holding unit 20, the entire lower end surface 202 of the first holding unit 20 which is a plate-shaped body made of metal, abuts on the surface of the wiring substrate 60. Thus, the heat transmitted to the first holding unit 20 is transmitted to the solder piece guide tube 10 and is transmitted to the wiring substrate 60.

Next, the thread solder piece 50 containing flux therein is supplied from the solder piece supply port 101 of the solder piece guide tube 10. When the thread solder piece 50 is fed, an assist gas 8 may be flown into the solder piece guide tube 10 through a guide tube (not shown) by a gas inflow unit (not shown). By the inflow of the assist gas 8 when the thread solder piece 50 is fed, oxidation of the solder material and the terminal 71 can be prevented. When the assist gas 8 passes through the solder piece guide tube 10, the space inside the solder piece guide tube 10 is heated to high temperature, and thus the wiring substrate 60 and the terminals 71 can be heated by thermal convection.

From the viewpoint of preventing the oxidation of the thread solder 50 and the terminal 71, an inert gas such as nitrogen or argon is suitably used as the assist gas 8. From the viewpoint of heating the wiring substrate 60 and the terminal 71, the kind of the gas is not particularly limited, for example, inexpensive air is suitable.

The thread solder supplied from the solder piece supply port 101 drops into the solder piece guide tube 101 along with the assist gas 8, and is melted by the heat of the first holding unit 20, the solder piece guide tube 10, and the wiring substrate 60 when the thread solder reaches the terminal 71. The terminal 71 is soldered in the through hole by the molten solder.

It is preferable that when the thread solder 50 is fed, outside air is circulated on the periphery of a region of the thread solder piece guide tube 101 that is exposed in the external space (the region P between the portion held by the first holding unit 20 and the portion held by the second holding unit 30) by convection so as to cool the region P of the solder piece guide tube 10.

For example, the cooling air generated by a cooling fan is sent toward the region between the support plates 81a and 81b so as to circulate the outside air on the periphery of the region P of the solder piece guide tube 10 by convection. Therefore, the region P of the solder piece guide tube 10 is cooled, so that a problem that the thread solder 50 melts before reaching the terminal 71 and adheres to the inner wall of the solder piece guide tube 10, or the like can be prevented.

In the example shown in FIG. 1, an aspect in which the region P of the solder piece guide tube 10 is exposed to the external space and the outside air is circulated on the periphery of the region P by convection is shown, but the invention is not necessarily limited thereto. For example, the periphery of the region P of the solder piece guide tube 10 may be surrounded by a housing, and the cooling air may be supplied into the housing.

A diameter and length of the thread solder piece 50 may be appropriately determined according to the amount of solder required for soldering. For example, in a case where an outer diameter of the terminal 71 is 0.6 mm, the diameter of the thread solder piece 50 is set to 0.8 mm, an inner diameter of the solder piece guide tube 10 is set to 1.3 mm, and the length of the thread solder piece 50 is set to 6 mm, so that in the solder piece guide pipe 10, the thread solder piece 50 can stand upright while being adjacent to the terminal 71. Therefore, the thread solder piece 50 is rapidly and uniformly heated.

Figure 2B:
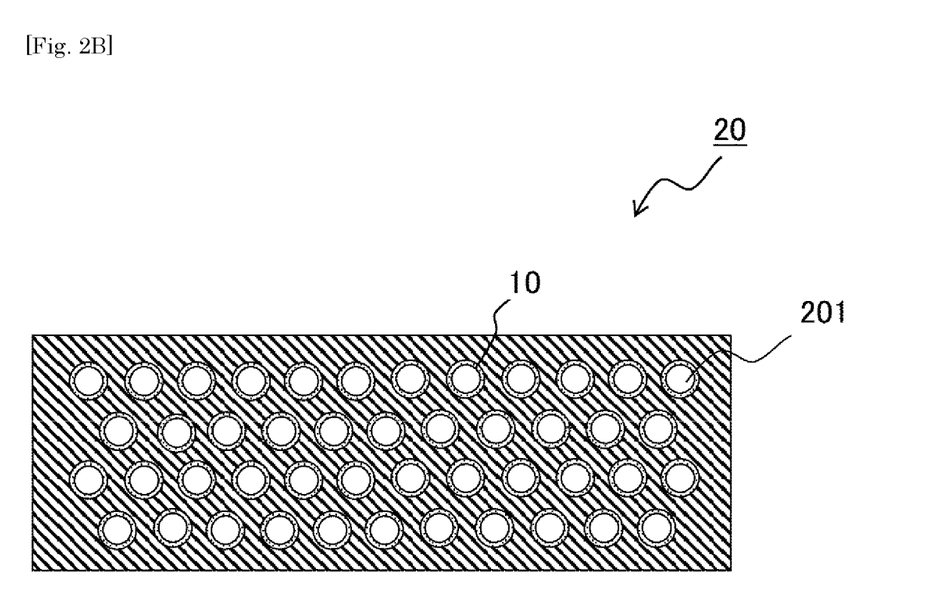
FIG. 2B is a bottom view of a first holding unit 20 in which solder piece guide tubes 10 are inserted, as seen from a lower end surface side of the solder piece guide tubes 10.

The arrangement of the hole portions 201 in the first holding unit 20 can be appropriately determined according to the arrangement of the terminals 71 on the wiring substrate 60 connected to the insertion mounting component 70. For example, as shown in FIG. 2A, the first holding unit 20 may have a configuration in which the hole portions 201 are arranged in a straight line both in the vertical direction and in the horizontal direction, or as shown in FIG. 2B, the first holding unit 20 may have a configuration in which the hole portions 201 are arranged in zigzag.

According to the soldering device 100 in the example described above, since the plurality of solder piece guide tubes 10 are provided, the plurality of terminals 71 can be soldered by one single operation. Therefore, the time required for the soldering operation can be shortened, as compared to a conventional soldering device in which the soldering is performed one by one using a tubular soldering iron.

According to the soldering device 100 in the example, since the tip end portion 102 of the solder piece guide tube 10 is arranged on the inner side of the first holding unit 20 without protruding to the outer side of the first holding unit 20, the first holding unit 20 can abut on the surface of the wiring substrate 60, which is an object to be soldered. Accordingly, since the heat of the heating unit 40 is transmitted to the wiring substrate 60 by the first holding unit 20, the contact area thereof with the wiring substrate 60 can be increased as compared to a case of using, for example, a tubular soldering iron. Therefore, the heat is easily transmitted to the rear surface of the wiring substrate 60. For this reason, even when the heat capacity of the inner layer or the lead wire connected to the through-hole land is large, the occurrence of so-called solder non-wetting, that is, the solidification of the solder material before the solder material reaches the rear surface of the wiring substrate 60, can be suppressed.

In the soldering device 100 according to the example, since the first holding unit 20 heated by the heating unit 40 and the solder piece guide tube 10 are separate members, the first holding unit 20 and the solder piece guide tube 10 can be formed using suitable materials respectively. That is, since the heat of the heating unit 40 can be transmitted to the wiring substrate 60 by the first holding unit 20, the solder non-wetting can be suppressed regardless of the material of the solder piece guide tube 10. For example, by forming the first holding unit 20 with a metal material having good thermal conductivity, such as aluminum, and forming the solder piece guide tube 10 with a glass tube, it is possible to obtain a soldering device 100 in which the occurrence of solder non-wetting can be suppressed and the manufacturing cost and the cost associated with replacement of the solder piece guide tube 10 can be reduced.

According to the soldering device 100 in the example, since the heat of the heating unit 40 is transmitted to each solder piece guide tube 10 and the wiring substrate 60 via the first holding unit 20, the heat of the heating unit 40 is substantially uniformly transmitted to the solder piece guide tubes 10 provided at a position away from the heating unit 40 or regions of the wiring substrate 60 away from the heating unit 40. Therefore, even when the plurality of terminals 71 are soldered at one time, the occurrence of solder non-wetting can be suppressed.

In the soldering device 100 shown in FIG. 1, since the tip end portion 102 of the solder piece guide tube 10 is formed on the same plane as the lower end surface 202 of the first holding unit 20, leakage of the solder material from each through-hole land to the adjacent through-hole land can be suppressed even if the wiring substrate 60 has irregularities, or a warpage is generated on the wiring substrate 60 at the time of soldering.

Figure 3:
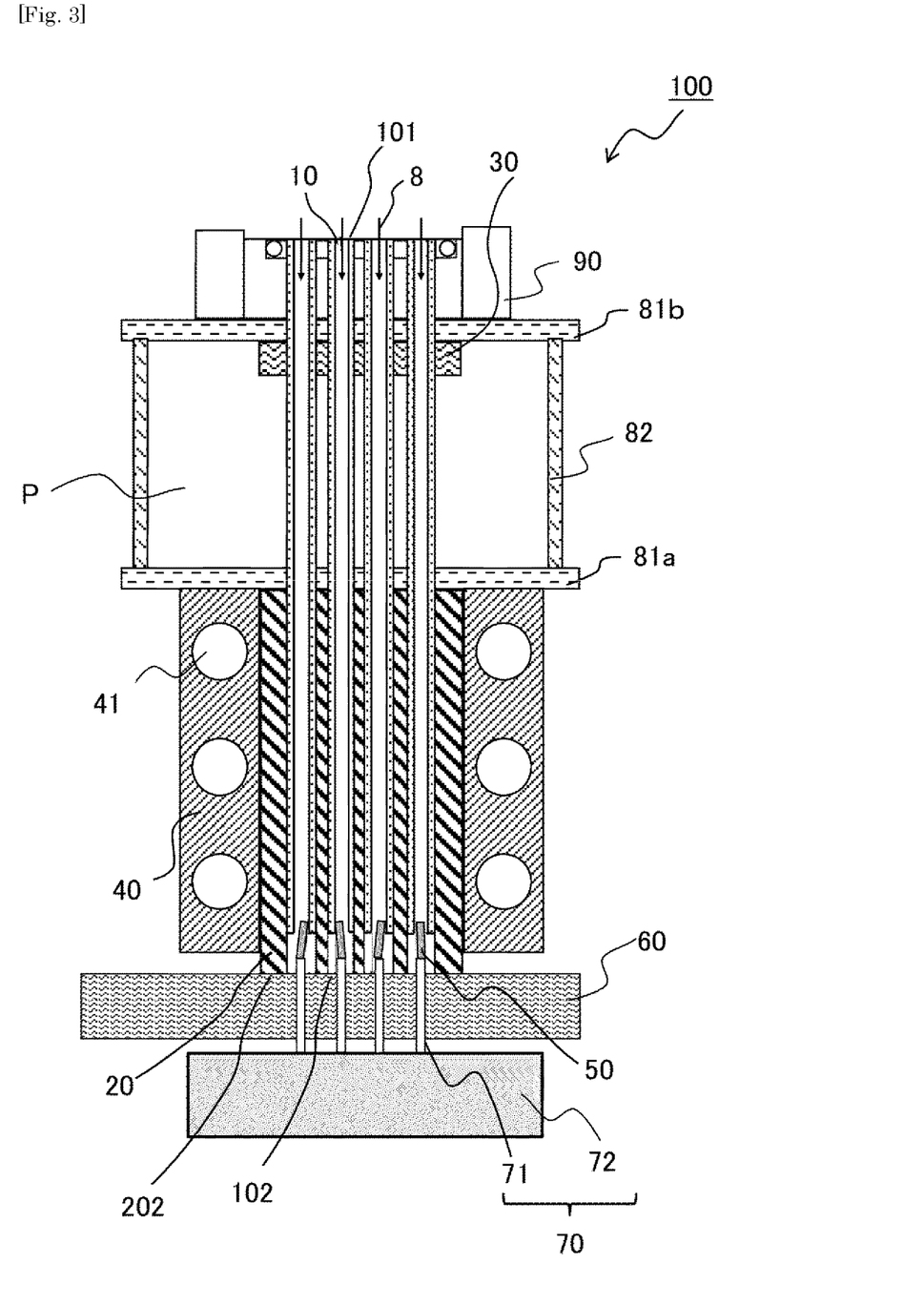
FIG. 3 is a sectional view of a soldering device according to an example.

As shown in FIG. 3, the tip end portion 102 of the solder piece guide tube 10 may be arranged rearward of the lower end surface 202 of the first holding unit 20, that is, at a position close to the side of the solder piece supply port 101. In this case, it is preferable that the tip end portion 102 is at least arranged closer to the side of the lower end surface 202 of the first holding unit 20 than an upper end of the thread solder piece 50 dropped above the terminal 71. Accordingly, even when the flux in the heated thread solder piece 50 adheres to the inner peripheral surface of the hole portions 201 of the first holding unit 20, the flux can be easily cleaned.

Figure 4:
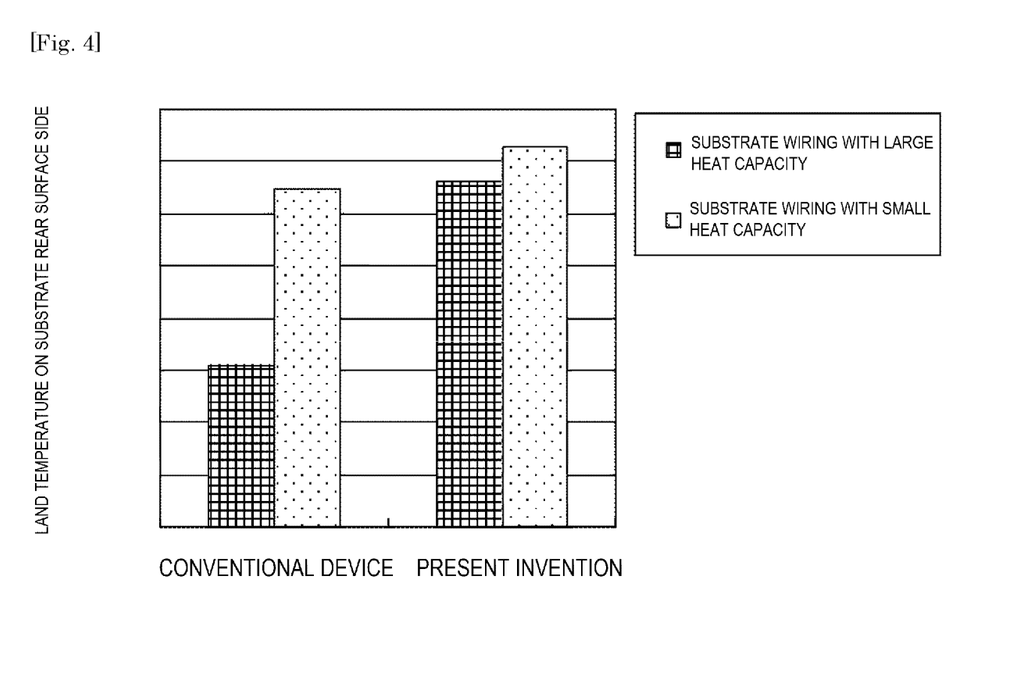
FIG. 4 is a diagram showing a measurement result of land temperatures on rear surface sides of wiring substrates when heated by soldering devices.

A measurement result of the land temperatures on the rear surface side of the wiring substrate when heated by soldering devices are shown in FIG. 4. FIG. 4 shows a measurement result of the land temperatures in a case where a conventional soldering device including a tubular soldering iron was used and in a case where the soldering device 100 shown in FIG. 1 was used, respectively. In the conventional soldering device, specifically, a configuration in which a single ceramic tubular soldering iron was heated by a heater provided on an outer periphery thereof was used. In the soldering device 100 shown in FIG. 1, an aluminum plate-shaped body was used as the first holding unit 20, and a glass tube was used as the solder piece guide tube 10.

Figure 5:
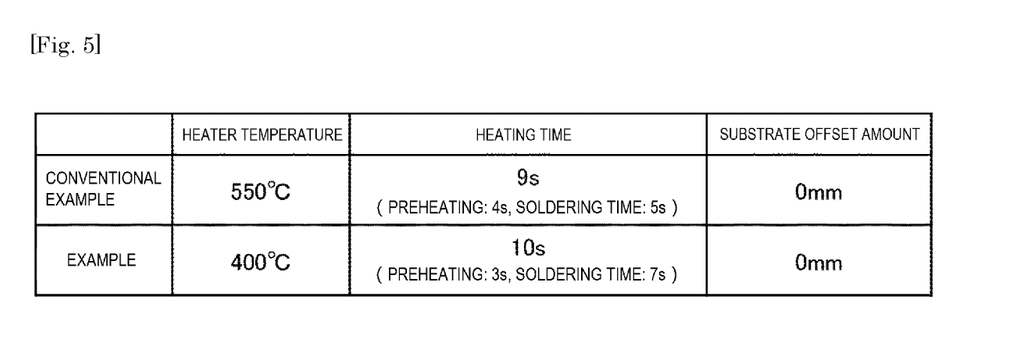
FIG. 5 is a diagram showing measurement conditions for measuring the land temperatures shown in FIG. 4.

The measurement of the temperatures was performed by contacting a thermocouple with a land on the rear surface of the wiring substrate 60. FIG. 5 shows the heating temperatures (° C.), heating times (second), and substrate offset amounts (mm) of the wiring substrates when the land temperatures are measured.

FIG. 4 shows the result of the temperature measurement performed when the heat capacity of the inner layer and the lead wire connected to the land of the wiring substrate is large and the result of the temperature measurement performed when the heat capacity of the inner layer and the lead wire connected to the land of the wiring substrate is small, respectively. As shown in FIG. 4, when the conventional soldering device was used, in a wiring substrate having a large heat capacity, the land temperature on the rear surface of the substrate was about ½ or less as compared to a wiring substrate having a small heat capacity.

Meanwhile, when the soldering device 100 shown in FIG. 1 was used, the temperature of the lands on the substrate rear surface of the wiring substrate 60 having a large heat capacity was approximately the same as the temperature of the wiring substrate 60 having a small heat capacity.

Figure 6:
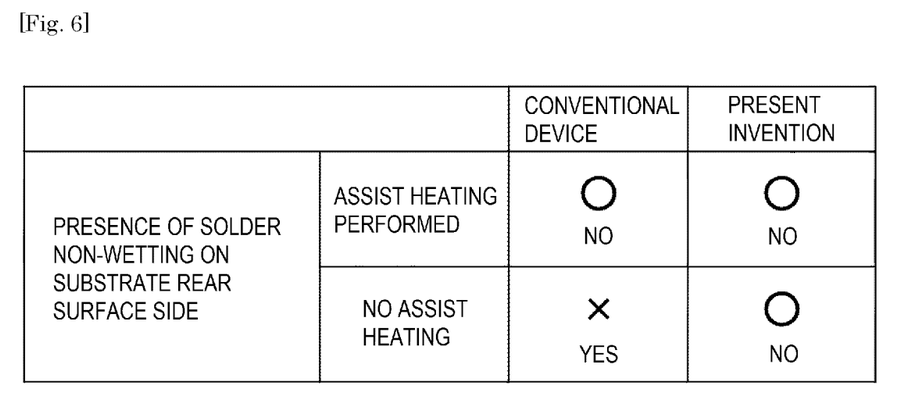
FIG. 6 is a diagram showing a comparison and examination result of necessity of assist heating for suppressing solder non-wetting.

Next, necessity of assist heating, which is performed to suppress solder non-wetting of the lands on the rear surface side of the wiring substrate, was compared. The result of the comparison is shown in FIG. 6. In FIG. 6, similarly with the verification of FIG. 4, a comparative verification was performed between the case of using the conventional soldering device and the case of using the soldering device 100 shown in FIG. 1.

In FIG. 6, with respect to the wiring substrate having a large heat capacity among the wiring substrates used in the verification of FIG. 4, the presence or absence of solder non-wetting when the soldering was performed was verified for each of the case of performing the assist heating and the case of not performing the assist heating.

The assist heating was performed by sending heat of a heat source provided in the vicinity of the wiring substrate toward a region where the soldering of the wiring substrate was performed. Conditions for the soldering were similar with the conditions for the verification shown in FIG. 4, which are shown in the table of FIG. 5. The presence or absence of solder non-wetting was determined by visually observing the lands on the rear surface side of the wiring substrate.

As shown in the table of FIG. 6, in the case where the conventional soldering device was used, when the assist heating was not performed on the wiring substrate having a large heat capacity, solder non-wetting occurred on the lands on the rear surface side of the wiring substrate, and the assist heating is necessary to prevent the non-wetting.

Meanwhile, in the soldering device 100 shown in FIG. 1, solder non-wetting on the lands on the rear surface side of the substrate was suppressed even without performing the assist heating on the wiring substrate having a large heat capacity. In the table of FIG. 6, "O" indicates that no solder non-wetting occurred, and "X" indicates that the solder non-wetting occurred.

REFERENCE SIGN LIST

100: soldering device
8: assist gas
10: solder piece guide tube
101: solder piece supply port
102: tip end portion
20: first holding unit
201: hole portion
202: lower end surface
30: second holding unit
40: heating unit
50: thread solder piece
60: wiring substrate
70: insertion mounting component
71: terminal
72: housing
81a, 81b: support plates
82: support pillar
90: fixing unit
P: region

The invention claimed is:

1. A soldering device, comprising:
    a plurality of tubular solder piece guide tubes which have space therein for a solder piece supplied from a supply port to pass through;
    a first holding unit which holds the plurality of solder piece guide tubes; and
    a heating unit which heats the first holding unit,
    wherein tip end portions of the plurality of solder piece guide tubes on a soldering side are arranged inside of the first holding unit; and
    a second holding unit which is arranged closer to a side of the supply port than the first holding unit and holds the plurality of solder piece guide tubes,
    wherein the plurality of solder piece guide tubes include a region exposed to external space between a portion thereof held by the first holding unit and a portion thereof held by the second holding unit.

2. The soldering device according to claim 1, wherein the first holding unit is a plate-shaped body made of metal, in which a plurality of hole portions are formed, and the plurality of solder piece guide tubes are inserted in the plurality of hole portions so as to be held in the first holding unit.

3. The soldering device according to claim 1, wherein an end surface of the first holding unit is capable of abutting on a surface of an object to be soldered, and the tip end portions of the solder piece guide tubes are arranged on the same plane as the end surface of the first holding unit.

4. The soldering device according to claim 1, wherein an end surface of the first holding unit is capable of abutting on a surface of an object to be soldered, and the tip end portions of the solder piece guide tubes are arranged rearward of the end surface of the first holding unit.

5. The soldering device according to claim 1, wherein the first holding unit is formed of aluminum or stainless steel, and the solder piece guide tubes are formed of glass, ceramic, aluminum, stainless steel, or titanium.

6. The soldering device according to claim 1, wherein the first holding unit is formed of aluminum or stainless steel, the second holding unit is formed of any of polyacetal resin, polycarbonate resin, epoxy resin, and phenol resin, and the solder piece guide tubes are formed of glass, ceramic, aluminum, stainless steel, or titanium.

7. The soldering device according to claim 1, further comprising:
    means which supplies cooling air to the region exposed to the external space.

* * * * *